United States Patent
Sicurella et al.

(10) Patent No.: US 10,713,446 B2
(45) Date of Patent: Jul. 14, 2020

(54) MULTIPLIER CIRCUIT, CORRESPONDING DEVICE AND METHOD

(71) Applicant: STMicroelectronics S.r.l., Agrate Brianza (IT)

(72) Inventors: Giovanni Sicurella, Catania (IT); Manuela La Rosa, Gravina di Catania (IT)

(73) Assignee: STMicroelectronics S.r.l., Agrate Brianza (MB) (IT)

(*) Notice: Subject to any disclaimer, the term of this patent is extended or adjusted under 35 U.S.C. 154(b) by 0 days.

(21) Appl. No.: 16/274,987

(22) Filed: Feb. 13, 2019

(65) Prior Publication Data

US 2019/0253039 A1    Aug. 15, 2019

(30) Foreign Application Priority Data

Feb. 15, 2018 (IT) .................. 102018000002702

(51) Int. Cl.
  *G01R 21/127* (2006.01)
  *G06G 7/161* (2006.01)

(52) U.S. Cl.
  CPC .......... *G06G 7/161* (2013.01); *G01R 21/127* (2013.01)

(58) Field of Classification Search
  CPC ......... G01R 21/127; G06G 7/16; G06G 7/161
  USPC ....................................... 327/356
  See application file for complete search history.

(56) References Cited

U.S. PATENT DOCUMENTS

| 3,104,319 A | 9/1963 | Ericson |
| 3,521,046 A | 7/1970 | Tippetts |
| 3,737,640 A * | 6/1973 | Pao .................. G06G 7/161 708/843 |
| 4,682,102 A | 7/1987 | Milkovic |
| 2019/0050721 A1* | 2/2019 | Busch ................ G06N 3/049 |
| 2019/0072590 A1* | 3/2019 | Kim .................. G01R 19/04 |

FOREIGN PATENT DOCUMENTS

EP    0218905 A1    4/1987

OTHER PUBLICATIONS

IT Search Report and Written Opinion for IT Appl. No. 102018000002702 dated Oct. 15, 2018 (9 pages).

* cited by examiner

*Primary Examiner* — William Hernandez
(74) *Attorney, Agent, or Firm* — Crowe & Dunlevy

(57) ABSTRACT

A voltage-to-time converter circuit receives a first voltage signal and produces a PWM-modulated signal having a duty-cycle proportional to the first voltage signal. A current integrator circuit receives the PWM-modulated signal from the voltage-to-time converter circuit block and produces an output signal by integrating a current signal from a current source over integration time intervals having a duration which is a function of the duty-cycle of the PWM-modulated signal. The current signal is proportional to a second voltage signal. The output signal is accordingly proportional to a product of the first voltage signal and the current signal, which is furthermore proportional to a product of the first voltage signal and the second voltage signal.

19 Claims, 3 Drawing Sheets

MULTIPLIER CIRCUIT, CORRESPONDING DEVICE AND METHOD

PRIORITY CLAIM

This application claims the priority benefit of Italian Application for Patent No. 102018000002702, filed on Feb. 15, 2018, the content of which is hereby incorporated by reference in its entirety to the maximum extent allowable by law.

TECHNICAL FIELD

The description relates to multiplier circuits.

One or more embodiments may be applied to a variety of electronic devices, such as power breakers, e-fuses, power monitor devices, data storage devices, and the like, both for consumer and for industrial applications.

BACKGROUND

Voltage and current/voltage analog multipliers are currently used, e.g., to monitor power consumption in several applications involving "smart" architectures for evaluating and managing power consumption.

Such applications may involve computing power by multiplying values indicative of a voltage and a current supplied to a load.

Conventional analog voltage multipliers may comprise a combination of logarithmic and anti-logarithmic amplifiers.

Another conventional approach for implementing an analog multiplier may involve using a MOSFET transistor as a voltage-controlled resistor.

In comparison with arrangements including logarithmic amplifiers, a MOSFET implementation may be advantageous due to fewer devices involved and a simpler implementation. A MOSFET implementation may have an intrinsic limitation in being based on a linear approximation of the MOSFET characteristics.

While analog architectures are increasingly and almost completely replaced by digital architectures (e.g., digital integrated circuits or ICs) in certain applications conventional circuits based on logarithmic amplifiers are still currently resorted to in order to provide signal compression, for instance.

Such arrangements suffer from intrinsic drawbacks of analog circuits such as, e.g. errors due to gain inaccuracies, bias currents, offset effects, temperature dependency and non-linearity as possibly related to operational amplifier (op-amp) structures. Still other drawbacks may be related to complex calibration techniques and large silicon area occupancy.

Certain basic textbooks such as, e.g. Ramon Pallas-Areny, et al.: "Analog signal processing", John Wiley & Sons, Inc. 1999, pp. 293-321 provide a comprehensive presentation of analog solutions as discussed in the foregoing.

There is a need in the art to provide improved solutions capable of facilitating signal multiplication by using an arrangement of reduced complexity with associated reductions in calibration time, cost and silicon area occupancy.

SUMMARY

The claims are an integral portion of the technical teaching provided herein in respect of embodiments.

One or more embodiments provide a circuit architecture which facilitates performing (analog) multiplication of two signals (values) by using a block of reduced complexity based on a ramp generator. One or more embodiments may include two complementary circuit blocks: a ramp-based voltage-to-time converter, and a sampled-time/current-multiplier. These two circuit blocks may be combined to provide an (analog) multiplier.

One or more embodiments may facilitate computing (continuously) the power dissipation of a device, e.g. according to a certain sampling frequency.

In comparison with conventional, logarithm-based analog multipliers, one or more embodiments exhibit a reduced silicon area occupancy and/or a more controllable process variation effects.

In an embodiment, a circuit comprises: a voltage-to-time converter circuit having an input node configured to receive a first voltage signal and produce a PWM-modulated signal having a duty-cycle proportional to the first voltage signal; a current integrator circuit coupled to the voltage-to-time converter circuit and receiving the PWM-modulated signal therefrom, the current integrator circuit configured to produce an output signal at an output node by integrating a second current signal from a current source over integration time intervals having a duration which is a function of the duty-cycle of the PWM-modulated signal from the voltage-to-time converter circuit, wherein the output signal is proportional to the product of the first voltage signal and the second current signal.

The second current signal from the current source may be proportional to a further voltage signal, wherein the output signal from the circuit is proportional to the product of the first voltage signal and the further voltage signal.

The voltage-to-time converter circuit comprises: a ramp generator configured to generate a sequence of a ramp waveforms, and a comparator having inputs receiving the sequence of ramp waveforms and the first voltage signal, respectively.

A gating circuit element is coupled to the output from the comparator and gated by a clock signal, the output from the gating circuit element providing said PWM-modulated signal.

The current integrator circuit block comprises: an integrator capacitance chargeable by the second current signal, and a gating switch active between the current source and the integrator capacitance, the gating switch driven by the PWM-modulated signal from the voltage-to-time converter circuit to selectively couple the current source with the integrator capacitance to enable integration of the second current signal over said integration times having a duration which is a function of the duty-cycle of the PWM-modulated signal from the voltage-to-time converter circuit.

The current integrator circuit comprises a reset switch configured to discharge the integrator capacitance between subsequent integration time intervals.

The current integrator circuit comprises a sample and hold circuit coupled to the integrator capacitance to sample integrated signals on the integrator capacitance, the output from the sample and hold circuit block providing said output signal from the circuit.

The current integrator circuit block comprises a respective gating circuit element controlled via the PWM-modulated signal from the voltage-to-time converter circuit block, wherein the sample and hold circuit block is synchronized with said PWM-modulated signal.

The gating circuit elements are gated by said clock signal.

In an embodiment, an electrical device comprises: a circuit according to one or more embodiments, and a user circuit coupled to the circuit to receive said output signal therefrom.

In an embodiments, a method comprises: receiving a first voltage signal and producing therefrom a PWM-modulated signal having a duty-cycle proportional to the first voltage signal; integrating a second current signal over integration time intervals having a duration which is a function of the duty-cycle of the PWM-modulated signal to generate the output signal which is proportional to a product of the first voltage signal and the second current signal.

The method further comprises generating the second current signal proportional to a further voltage signal, wherein the output signal is proportional to the product of the first voltage signal and the further voltage signal.

BRIEF DESCRIPTION OF THE DRAWINGS

One or more embodiments will now be described, by way of example only, with a reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
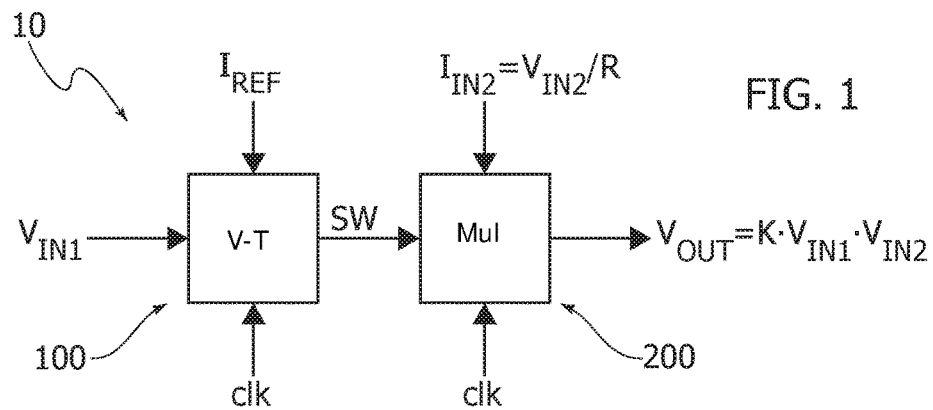
FIG. 1 is exemplary of a possible architecture of embodiments.

In FIG. 1 reference 10 denotes as a whole the architecture of an (analog) circuit arrangement which facilitates the multiplication of (analog) signals by using circuit blocks of reduced complexity while exhibiting features such as reduced calibration time and cost as well as reduced silicon area occupancy (in the case of implementation as an integrated semiconductor circuit).

In one or more embodiments, a circuit 10 as exemplified herein may be intended to produce an output voltage $V_{OUT}$ which is a function (proportional) of the product of a voltage input signal $V_{IN1}$ and a current input signal $I_{IN2}$.

In one or more embodiments, the input current $I_{IN2}$ can be generated (in a manner known per se) for example as a function of a voltage drop $V_{IN2}$ applied across a resistor $R_{IN2}$ (that is $I_{IN2}=V_{IN2}/R_{IN2}$) so that the output voltage $V_{OUT}$ is proportional (e.g. via a constant K) to the product of the (input) voltages $V_{IN1}$ and $V_{IN2}$, that is: $V_{OUT}=K*V_{IN1}*V_{IN2}$, where K is proportional to $1/R_{IN2}$.

In one or more embodiments the circuit 10 as exemplified in FIG. 1 may comprise a cascaded arrangement of two circuit blocks namely:
  a ramp-based voltage-to-time (V-T) converter 100, and
  a sampled time/current multiplier (Mul) 200 comprising a sample-and-hold (S & H) component.

In one or more embodiments, the two circuits 100 and 200 are controlled (clocked) by a (same) clock signal clk, generated—in a manner known per se—via a clock signal source not visible in the figures.

Figure 2:
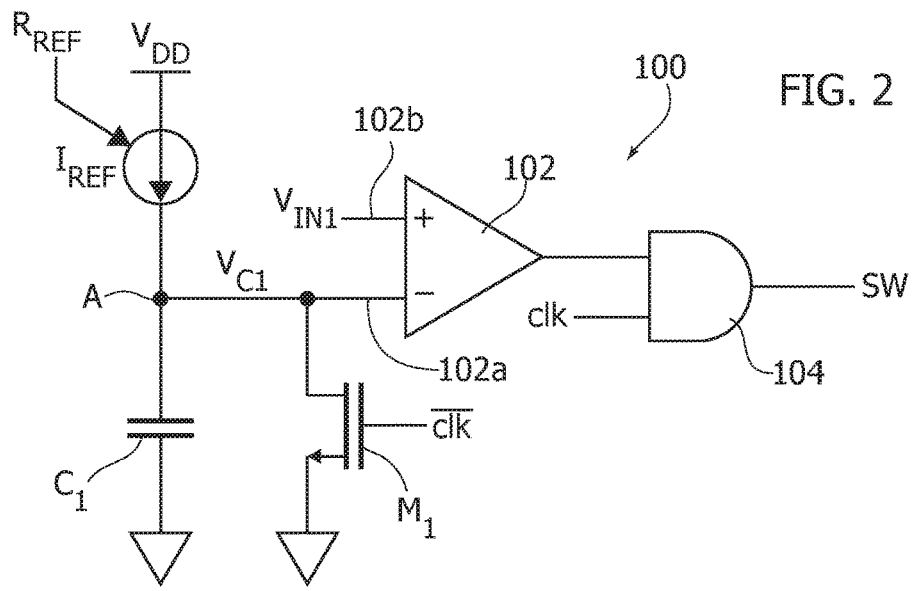
FIGS. 2 and 3 are circuit diagrams exemplary of a possible implementation of certain parts of embodiments.
Figure 3:
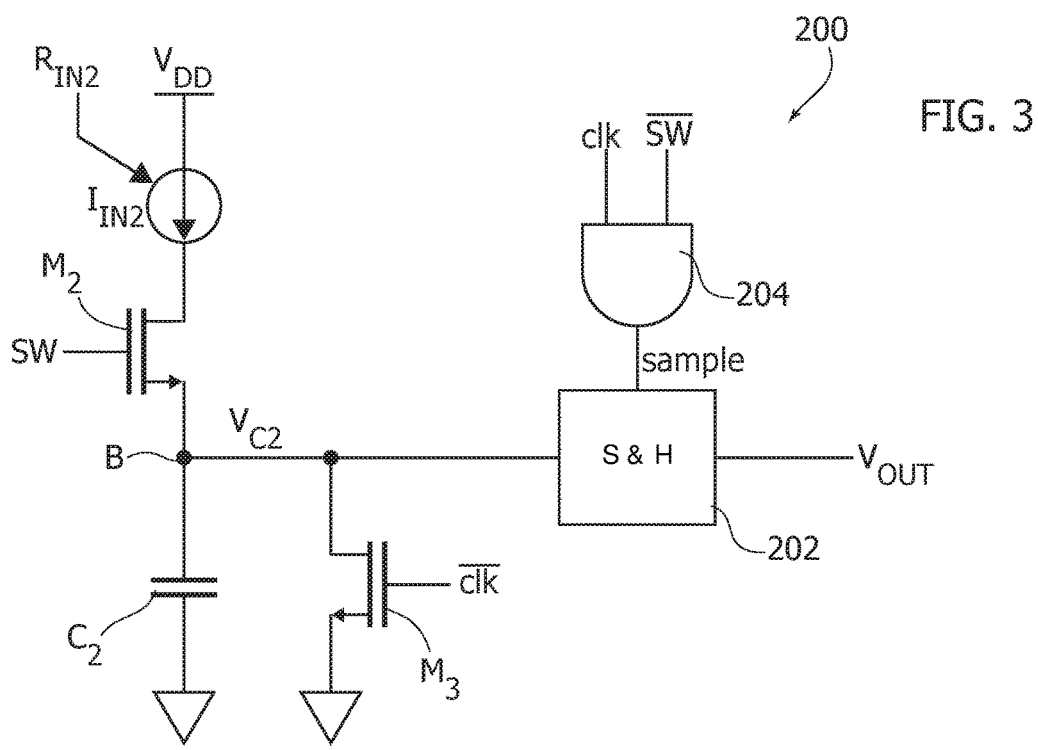

Circuit diagrams of possible embodiments of the circuit blocks 100 and 200 are exemplified in FIGS. 2 and 3, respectively.

In one or more embodiments as exemplified in FIG. 2, the ramp-based voltage-to-time (V-T) converter circuit 100 is intended to generate a PWM-modulated signal, that is a digital pulsed signal SW having the same frequency of the clock, clk and a duty-cycle proportional to the input voltage $V_{IN1}$.

A current definition of duty cycle is the fraction of one period of a signal where the signal is "on" or active, that is the ratio of the "on" time to the sum of the "on" and "off" times in a period of the signal.

In one or more embodiments, the ramp-based voltage-to-time (V-T) converter circuit 100 may include a ramp generator comprising a constant reference current generator (providing a current $I_{REF}$ generated by any conventional means known for that purpose, e.g. as a function of the resistance value $R_{REF}$ of a reference resistor) coupled between a supply voltage node at a voltage $V_{DD}$ and a node A. A capacitor $C_1$ is in turn arranged between the node A and ground to be charged by the current $I_{REF}$.

Figure 4:
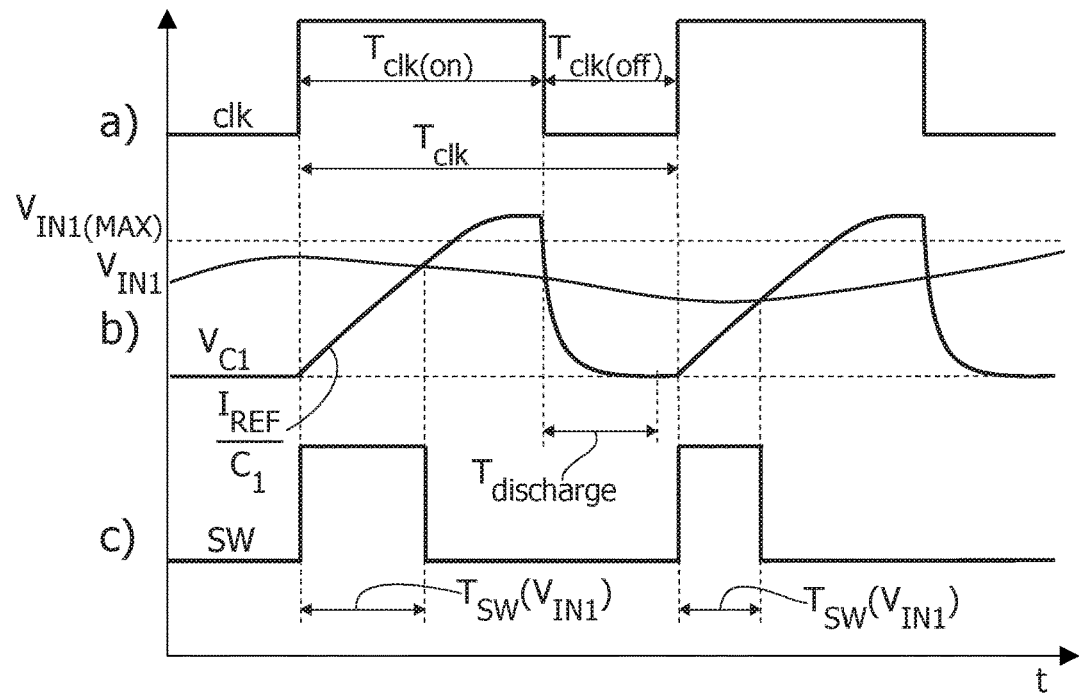
FIG. 4 is exemplary of the possible time behavior of certain signals in the circuit portion exemplified in FIG. 2.

Constant reference current generators are conventional in the art: see, e.g., the circuit of FIG. 4.50 in Gray, Mayer et al.: "Analysis and Design of Analog Integrated Circuits" 4th edition, pp. 299-327.

In one or more embodiments a current $I_{IN2}$ (t)=$V_{IN2}(t)/R_{IN2}$ can be generated by means of voltage-to-current converters which take into account variability over time of the signals involved. Corresponding exemplary solutions are disclosed, e.g., in Ramon Pallas-Areny, et al. (already cited) pp. 148-179 or V. Srinivasan, et al.: "Linear current-to-voltage and voltage-to-current converters" 48th Midwest Symposium on Circuits and Systems, 2005, Covington, KY, 2005, pp. 675-678 Vol. 1 (see, e.g., the circuit in FIG. 1c therein).

The voltage across the capacitor $C_1$ at the node A (which voltage is indicated as $V_{C1}$) can be applied to a comparator 102 to be compared with the input voltage $V_{IN1}$.

For instance, in an embodiment as exemplified in FIG. 2, the voltages $V_{C1}$ and $V_{IN1}$ can be applied, respectively, to the inverting input 102a and the non-inverting input 102b of the comparator 102 with the non-inverting input 102b (to which the voltage $V_{IN1}$ is applied) acting as a (first) input node to the circuit 10.

An electronic switch (e.g., a MOSFET transistor) $M_1$ is coupled between the node A and ground (that is between the inverting input 102a of the comparator 102 and ground) with the capability of being selectively turned on (that is, made conductive) as a function of a complementary (negated) replica neg(clk) of the clock signal clk applied to the control terminal (gate, in the case of a field effect transistor such as a MOSFET transistor) of the transistor $M_1$.

The output from the comparator 102 and the clock signal clk are applied to the inputs of an AND gate 106 so that the clock signal clk performs a gating action on the output signal from the comparator 102 thereby providing the signal SW.

The diagrams in FIG. 4 are representative of possible time behaviors, referenced to a common time scale (abscissa t), of the following signals:

waveform a) shows the clock signal clk,
waveform b) shows the input voltage signal $V_{IN1}$ (referred to a maximum value $V_{IN1(MAX)}$) and the voltage $V_{C1}$, and
waveform c) shows the signal SW.

As noted (and in a manner known per se, as conventionally used in various applications involving PWM modulation of signals), the output signal SW exhibits a duty-cycle which is proportional to the input voltage $V_{IN1}$.

In a circuit arrangement as exemplified in FIG. 2 when the clk signal is low, the switch $M_1$ can be activated, that is made conductive (due to the complementary or negated value neg(clk) of the clock signal clk being "high" when clk is "low") thus keeping the voltage across the capacitor $C_1$ (namely $V_{C1}$) to ground so that also the output signal SW is low.

When the clk signal goes high, also the SW signal goes high and the voltage ramp starts rising across the capacitor $C_1$ with a fixed slope $I_{REF}/C_1$.

As a result of the ramp reaching the value of $V_{IN1}$, the output of the comparator 102 goes low and signal SW switches to zero. The duration of the SW pulse is thus proportional to the input voltage $V_{IN1}$, namely: $T_{SW}(V_{IN1}) = (C_1/I_{REF})*V_{IN1}$.

In one or more embodiments, a judicious selection of the value for $V_{IN(MAX)}$ may confine the working region of the ramp generator in the linear zone (slope given by $I_{REF}/C_1$).

Also, in one or more embodiments, the following criteria may apply for selecting the period of the clock signal clk by taking into account the bandwidth of the input signal $V_{IN1}$, namely:

$$T_{clk(on)} \geq T_{SW(max)} = (C_1/I_{REF})*V_{IN1(max)}$$

$$T_{clk(off)} > T_{discharge}(C_1) = 3*C_1*R_{ON(M1)}$$

$$T_{clk} > C_1*((V_{IN1(max)}/I_{REF}) + 3*R_{ON(M1)})$$

where (see also the diagrams in FIG. 4):

$T_{clk(on)}$ and $T_{clk(off)}$ denote the "on" and "off" times of the clock signal clk, having a period $T_{clk} = T_{clk(on)} + T_{clk(off)}$;

$T_{SW(MAX)}$ denotes the maximum duration of the pulses of the signal SW;

$T_{discharge(C1)}$ denotes the discharge time of the capacitor $C_1$ (switch M1 made conductive to couple the node A to ground);

$R_{ON(M1)}$ indicates the "on" resistance of the switch $M_1$ when implemented by means of a field effect transistor such as a MOSFET transistor.

In one or more embodiments as exemplified in FIG. 3, the sampled time/current multiplier (Mul) circuit 200 aims at obtaining an output voltage $V_{OUT}$ from the sampling of the voltage across the capacitor $C_2$ ($V_{C2}$). The voltage $V_{C2}$ is given from the integration of an input current $I_{IN2}$ according to the integration time given by the input signal SW.

As noted, the input current $I_{IN2}$ (exemplified in the diagram of FIG. 3 as a corresponding current generator coupled to supply node at the voltage $V_{DD}$) can be obtained—in a manner known per se, e.g. as discussed previously in connection with the current $I_{REF}$—as a function of a second input voltage $V_{IN2}$ and a resistance value $R_{IN2}$ based on a relationship of the type $V_{IN2}/R_{IN2}$.

In one or more embodiments, the integration time of the current $I_{IN2}$ can be determined as a function of an input signal represented by the output signal SW from the circuit block 100.

In one or more embodiments, such integration time may involve letting the current $I_{IN2}$ charge an integrator capacitor $C_2$ set between a node B and ground during the intervals where the signal SW has a certain value (e.g., high).

To that effect the current generator $I_{IN2}$ can be arranged in series with a further electronic switch $M_2$ which, again, may be implemented by resorting to a MOSFET transistor adapted to be made selectively conductive via the signal SW applied to the control terminal (gate, in the case of a field-effect transistor such as a MOSFET transistor).

As exemplified herein, the transistor $M_2$ is arranged in series with the current generator $I_{IN2}$ between the current generator $I_{IN2}$ and the node B, that is between the current generator $I_{IN2}$ and the capacitor $C_2$.

In that way the current from the current generator $I_{IN2}$ charges the capacitor $C_2$ and is thus integrated over time intervals (e.g., $T_{SW}(t)$) that have a duration equal to the "on" times of the signal SW are thus a function of (e.g. proportional to) the duty-cycle of the PWM-modulated signal from the voltage-to-time converter circuit block.

At the node B (that is, across the integrator capacitor $C_2$) an "integrated" voltage $V_{C2}$ is present which can be supplied to a sample and hold (S&H) circuit 202 whose sample input is controlled by the output of an AND gate 204 whose inputs receive the clock signal clk and a complementary (negated) replica of the signal SW, indicated neg(SW).

A further switch $M_3$ (which again can be implemented by means of an electronic switch such as a MOSFET transistor) is active between the node B (that is the voltage $V_{C2}$—input to the sample and hold circuit block 202) and ground.

The switch $M_3$ is configured to be made selectively conductive (thereby coupling the node B to ground) by a complementary (negated) replica of the clock signal clk, neg(clk) applied to its control terminal (again the gate, in the case of a field effect transistor such as a MOSFET transistor).

In one or more embodiments, the voltage $V_{C2}$ at node B (that is the voltage across the capacitor $C_2$), is directly related to the integration of the current $I_{IN2}$ as performed by the capacitor $C_2$, under the "sampling" control of the signal SW from the circuit block 100 vie the switch $M_2$.

Figure 5:
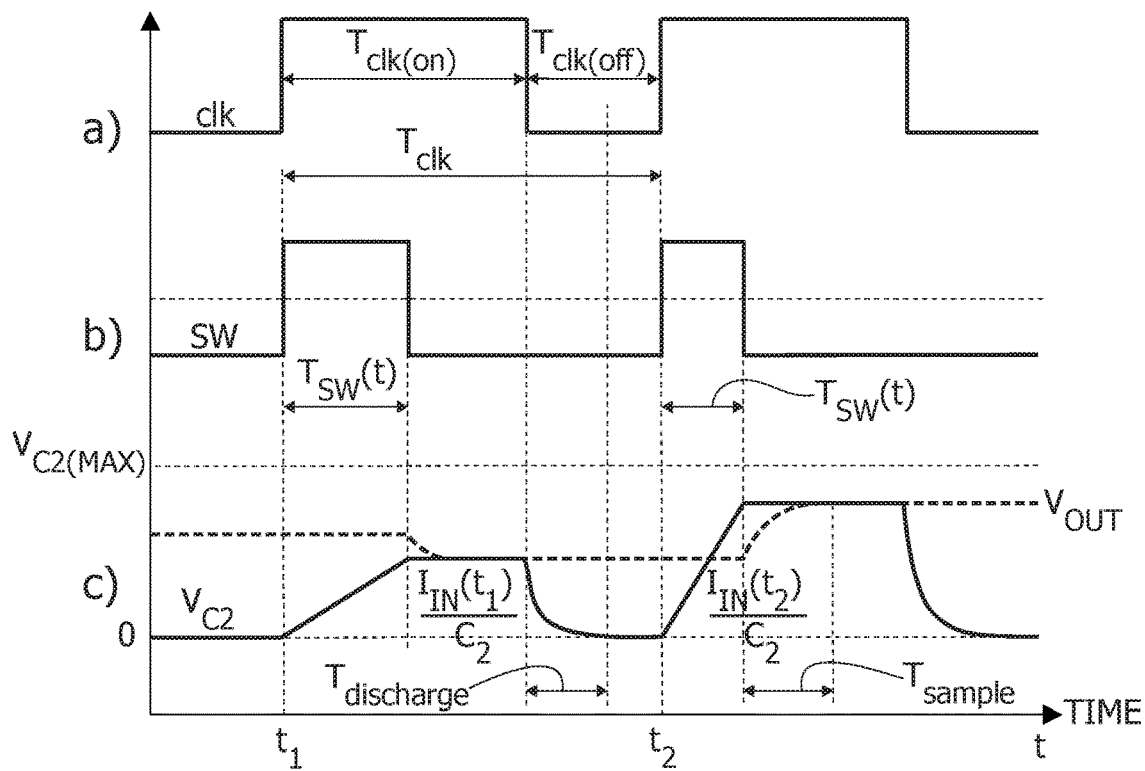
FIG. 5 is exemplary of the possible time behavior of certain signals in the circuit portion exemplified in FIG. 3.

The diagrams of FIG. 5 are exemplary (again with reference to a common time scale—abscissa t) of a possible time behavior of the following signals:

waveform a) shows the clock signal clk,
waveform b) shows the signal SW, and
waveform c) shows the voltage $V_{C2}$ at node B (input to the sample and hold circuit 202) as provided by the integration over a time interval $T_{SW}(t)$ of the current of the generator $I_{IN2}$ (as a function of the second input voltage $V_{IN2}$) and further shows (in dashed line) the output signal $V_{OUT}$ from the circuit.

The value $V_{C2MAX}$ in portion c) of FIG. 5 is exemplary of a maximum value for the voltage $V_{C2}$.

In one or more embodiments, the (variation of) $V_{C2}$ can be sampled by the sample and hold circuit block 202. Consequently, the current $I_{IN2}$ can be regarded as (almost) constant during one period $T_{SW}$ of the signal SW, so that: $V_{OUT}(t)=(T_{SW}(t)*I_{IN2}(t))/C_2$.

Again, in one or more embodiments certain constraints may be applied to the period of the clock signal clk related to the sampling time $T_{sample}$ of the sample and hold circuit block 202, the maximum value for the period of the signal SW, namely $T_{SW(MAX)}$ and the discharge time $T_{discharge}(C_2)$ of the capacitor $C_2$ via the switch (transistor) $M_3$:

$$T_{clk(on)}>T_{SW(max)}+T_{sample}$$

$$T_{clk(off)}>T_{discharge}(C_2)=3*C_2*R_{ON(M3)}$$

$$T_{clk}>T_{SW(max)}+T_{sample}+3*C_2*R_{ON(M3)}$$

where $R_{ON(M3)}$ is the "on" resistance of the MOSFET transistor $M_3$.

In order to facilitate avoiding undesired operation in the saturation region of the integrator network comprising the capacitor $C_2$, an upper bound for the input current $\max(I_{IN2})$ can be selected based on the following relationship:

$$\max(I_{IN2})<C_2*(V_{C2(MAX)}/T_{SW(MAX)}).$$

Figure 6:
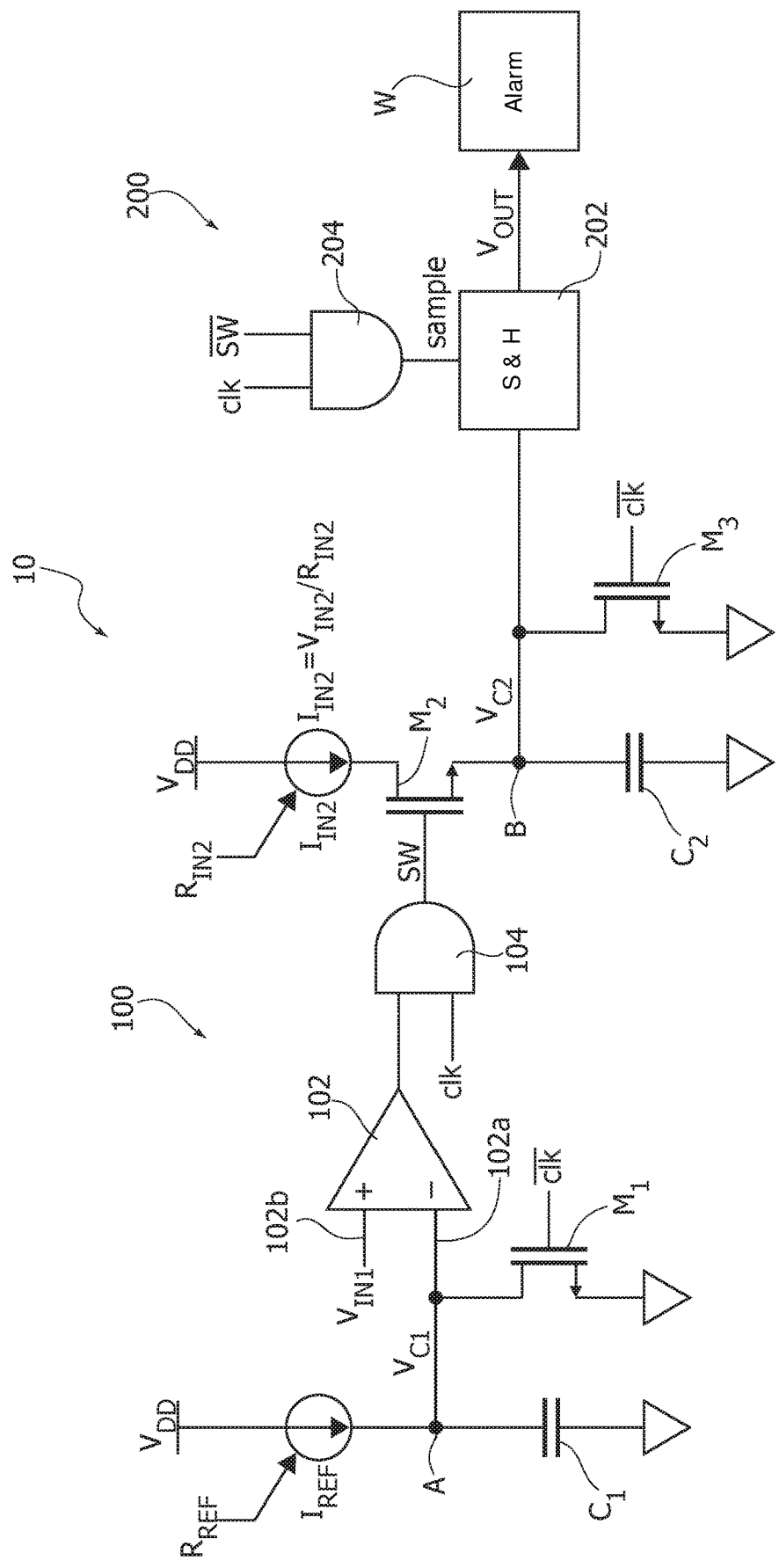
FIG. 6 is a circuit diagram of embodiments combining the circuit blocks exemplified in FIG. 2 and FIG. 3.

FIG. 6 is a general representation of a multiplier circuit resulting from the combination of the two circuits 100 and 200 of FIGS. 2 and 3, with the output signal SW from the first circuit 100 applied to the control terminal (gate, in the case of a field effect transistor such as a MOSFET transistor) of the switch $M_2$ in the circuit 200.

The multiplier circuit of FIG. 6 can thus provide an output (voltage) signal $V_{OUT}$ which (by substituting $T_{SW}$ in the equation for $V_{OUT}$ given above) can be expressed as:

$$V_{OUT}(t)=(C_1/(C_2*I_{REF}))*V_{IN1}(t)*I_{IN2}(t).$$

By assuming that the input current $I_{IN2}$ is generated (in any known manner for that purpose, as discussed previously) as a function of a voltage drop $V_{IN2}$ on a resistor $R_{IN2}$ (with a same arrangement possibly adopted for generating the reference current $I_{REF}$ as a function of a voltage drop of reference voltage $V_{REF}$ on a resistor $R_{REF}$) the output equation can be expressed as:

$$V_{OUT}(t)=((C*R_{REF})/(V_{REF}*C_2*R_{IN2}))*V_{IN1}(t)*I_{IN2}(t).$$

By assuming (which is reasonable) that good matching can be achieved between $C_1$, $C_2$, and $R_{REF}$ and $R_{IN2}$, an almost constant ratio can be obtained as:

$$K=(C_1*R_{REF})/(V_{REF}*C_2*R_{IN2})$$

leading to a final output equation of the kind:

$$V_{OUT}(t)=K*V_{IN1}(t)*V_{IN2}(t).$$

In one or more embodiments a judicious choice for the clock signal may comply (for both circuits 100, 200) with the following constrains:

$$T_{clk(on)}>T_{SW(max)}+T_{sample}$$

$$\max(V_{IN1})=(T_{SW(max)}/C_1)*I_{REF}$$

$$T_{clk(off)}>\max(T_{discharge}(C_1),T_{discharge}(C_2))$$

$$\max(I_{IN2})<C_2*(V_{C2(max)}/T_{SW(max)}).$$

One or more embodiments lend themselves to be implemented by using BCD (Bipolar-CMOS-DMOS) technology.

One or more embodiments may be applied to controlling the value of the product of a voltage input and a current input so that e.g. as a result of upper threshold value being reached an alarm circuit W can be activated.

Such a circuit arrangement can be applied, e.g. in devices such as power breakers, e-fuses and a number of power monitoring applications.

Evaluations performed on the bases of a general circuit diagram as exemplified in FIG. 6 showed that improved accuracy can be obtained for higher values for $V_{IN1}$ and $I_{IN2}$.

A circuit (e.g., 10) according to one or more embodiments comprises:

a voltage-to-time converter circuit (e.g., 100) having an input node (e.g., 102b) configured to receive a first voltage signal (e.g., $V_{IN1}$) and produce a PWM-modulated signal (e.g., SW) having a duty-cycle proportional to the first voltage signal, a current integrator circuit (e.g., 200) coupled to the voltage-to-time converter circuit and receiving the PWM-modulated signal therefrom, the current integrator circuit configured to produce an output signal (e.g., $V_{OUT}$) at an output node by integrating a second current signal (e.g. $I_{IN2}$) from a current source (e.g., $I_{IN2}$, $R_{IN2}$) over integration time intervals (e.g., $T_{SW}(t)$) having a duration which is a function of (e.g. proportional to) the duty-cycle of the PWM-modulated signal from the voltage-to-time converter circuit block, wherein the output signal is proportional to the product of the first voltage signal and the second current signal.

In one or more embodiments, the second current signal from the current source may be proportional to a further voltage signal (e.g., $V_{IN2}$), wherein the output signal from the circuit is proportional to the product of the first voltage signal and the further voltage signal.

In one or more embodiments, the voltage-to-time converter circuit comprises:

a ramp generator (e.g., $I_{REF}$, $C_1$, $M_1$) configured to generate a sequence of a ramp waveforms, and a comparator (e.g., 102) having inputs (e.g., 102a, 102b) receiving the sequence of ramp waveforms and the first, voltage signal, respectively.

One or more embodiments may comprise a gating circuit element (e.g., 104) coupled to the output from the comparator and gated by a clock signal (e.g. clk), the output from the gating circuit element providing said PWM-modulated signal.

In one or more embodiments, the current integrator circuit block comprises:

an integrator capacitance (e.g., $C_2$) chargeable by the second current signal from said current source, and a gating switch (e.g., $M_2$) active between the current source and the integrator capacitance, the gating switch driven by the PWM-modulated signal from the voltage-to-time converter circuit block to selectively couple the current source with the integrator capacitance to enable integration of the second current signal from said current source over said integration times having a duration which is a function of the duty-cycle of the PWM-modulated signal (SW) from the voltage-to-time converter circuit (100).

In one or more embodiments, the current integrator circuit may comprise a reset switch (e.g., $M_3$) configured to discharge the integrator capacitance between subsequent integration time intervals.

In one or more embodiments, the current integrator circuit may comprise a sample and hold circuit block (e.g., 202) coupled to the integrator capacitance to sample integrated signals (e.g., B, $V_{C2}$) on the integrator capacitance, the output from the sample and hold circuit block providing said output signal from the circuit.

In one or more embodiments, the current integrator circuit may comprise a respective gating circuit element (e.g. 204) controlled via the PWM-modulated signal (e.g., via the complementary or negated version neg(SW)) from the voltage-to-time converter circuit block, wherein the sample and hold circuit block is synchronized with said PWM-modulated signal.

In one or more embodiments, said gating circuit element (e.g., 104) and said respective gating circuit element (e.g., 204) are gated by said clock signal.

In one or more embodiments, an electrical device (e.g., 10, W) comprises:
a circuit according to one or more embodiments, and
a user circuit (e.g., W) coupled to the circuit (10) to receive said output signal therefrom.

In one or more embodiments, a method may comprise:
receiving a first voltage signal (e.g., $V_{IN1}$) and producing therefrom a PWM-modulated signal having a duty-cycle proportional to the first voltage signal,
integrating a second current signal (e.g. $I_{IN2}$) over integration time intervals having a duration which is a function of (e.g. proportional to) the duty-cycle of the PWM-modulated signal, wherein the output signal is proportional to the product of the first voltage signal and the second current signal.

One or more embodiments comprise generating the second current signal proportional to a further voltage signal (e.g., $V_{IN2}$), wherein the output signal is proportional to the product of the first voltage signal (e.g., $V_{IN1}$) and the further voltage signal (e.g., $V_{IN2}$).

Without prejudice to the underlying principles, the details and embodiments may vary, even significantly, without departing from the extent of protection.

The extent of protection is determined by the annexed claims.

The invention claimed is:

1. A circuit, comprising:
a voltage-to-time converter circuit, comprising:
a ramp generator configured to generate a periodic ramp waveform;
a comparator having a first input configured to receive said periodic ramp waveform and a second input configured to receive a first voltage signal; and
a gating circuit element coupled to an output of the comparator and gated by a clock signal, wherein an output from the gating circuit element produces a PWM-modulated signal having a duty-cycle proportional to the first voltage signal; and
a current integrator circuit coupled to receive the PWM-modulated signal from the voltage-to-time converter circuit and configured to produce an output signal at an output node by integrating a current signal generated by a current source over integration time intervals having a duration which is a function of the duty-cycle of the PWM-modulated signal, wherein the output signal is proportional to a product of the first voltage signal and the current signal.

2. The circuit of claim 1, wherein the current signal is proportional to a second voltage signal and wherein the output signal is proportional to a product of the first voltage signal and the second voltage signal.

3. The circuit of claim 1, wherein the current integrator circuit comprises:
an integrator capacitance chargeable by the current signal, and
a gating switch active between the current source and the integrator capacitance, the gating switch being driven by the PWM-modulated signal to selectively couple the current source with the integrator capacitance to enable integration of the current signal over said integration time intervals.

4. The circuit of claim 3, wherein the current integrator circuit further comprises a reset switch configured to discharge the integrator capacitance between subsequent integration time intervals.

5. The circuit of claim 3, wherein the current integrator circuit further comprises a sample and hold circuit coupled to the integrator capacitance and configured to sample integrated signals on the integrator capacitance, wherein an output from the sample and hold circuit provides said output signal.

6. The circuit of claim 5, wherein the current integrator circuit further comprises a gating circuit element controlled by the PWM-modulated signal, wherein operation of the sample and hold circuit is synchronized with said PWM-modulated signal.

7. The circuit of claim 6, wherein said gating circuit element is gated by said clock signal.

8. The circuit of claim 1, further comprising a user circuit coupled to receive said output signal.

9. The circuit of claim 8, wherein said user circuit is an alarm circuit.

10. A circuit, comprising:
a voltage-to-time converter circuit configured to receive a first voltage signal at an input node and produce a PWM-modulated signal having a duty-cycle proportional to the first voltage signal; and
a current integrator circuit coupled to receive the PWM-modulated signal from the voltage-to-time converter circuit and configured to produce an output signal at an output node by integrating a current signal generated by a current source over integration time intervals having a duration which is a function of the duty-cycle of the PWM-modulated signal, wherein the output signal is proportional to a product of the first voltage signal and the current signal, wherein the current integrator circuit comprises:
an integrator capacitance chargeable by the current signal;
a gating switch active between the current source and the integrator capacitance, the gating switch being driven by the PWM-modulated signal to selectively couple the current source with the integrator capacitance to enable integration of the current signal over said integration time intervals; and
a sample and hold circuit coupled to the integrator capacitance and configured to sample integrated signals on the integrator capacitance, wherein an output from the sample and hold circuit provides said output signal.

11. The circuit of claim 10, wherein the current signal is proportional to a second voltage signal and wherein the output signal is proportional to a product of the first voltage signal and the second voltage signal.

12. The circuit of claim 10, wherein the current integrator circuit further comprises a reset switch configured to discharge the integrator capacitance between subsequent integration time intervals.

13. The circuit of claim 10, wherein the current integrator circuit further comprises a gating circuit element controlled by the PWM-modulated signal, wherein operation of the sample and hold circuit is synchronized with said PWM-modulated signal.

14. The circuit of claim 13, wherein said gating circuit element is gated by a clock signal.

15. The circuit of claim 10, further comprising a user circuit coupled to receive said output signal.

16. The circuit of claim 15, wherein said user circuit is an alarm circuit.

17. A voltage-to-time converter circuit, comprising:
- a ramp generator configured to generate a periodic ramp waveform;
- a comparator having a first input configured to receive said periodic ramp waveform and a second input configured to receive a first voltage signal; and
- a gating circuit element coupled to an output of the comparator and gated by a clock signal, wherein an output from the gating circuit element produces a PWM-modulated signal having a duty-cycle proportional to the first voltage signal.

18. The circuit of claim 17, wherein the gating circuit is a logical AND gate.

19. The circuit of claim 17, wherein the ramp generator comprises:
- a capacitance chargeable by a current signal; and
- a reset switch configured to discharge the capacitance in response to a logical inverse of the clock signal.

* * * * *